United States Patent [19]

Vig

[11] 4,107,349

[45] Aug. 15, 1978

[54] METHOD OF ADJUSTING THE FREQUENCY OF PIEZOELECTRIC RESONATORS

[75] Inventor: John R. Vig, Monmouth County, N.J.

[73] Assignee: The United States of America as represented by the Secretary of the Army, Washington, D.C.

[21] Appl. No.: 824,185

[22] Filed: Aug. 12, 1977

[51] Int. Cl.² .................. B05D 3/06; D05D 5/12
[52] U.S. Cl. .................... 427/36; 29/25.35; 53/7; 427/9; 427/10; 427/41; 427/44; 427/53; 427/54; 427/10 D
[58] Field of Search .......... 427/41, 35, 36, 40, 427/44, 53, 54, 100, 9, 10; 204/159.13, 159.22; 29/25.35; 58/23 TF; 53/7

[56] References Cited

U.S. PATENT DOCUMENTS

| | | | |
|---|---|---|---|
| 2,437,912 | 3/1948 | Frondel | 29/25.35 |
| 3,069,283 | 12/1962 | Coleman | 427/41 |
| 3,162,561 | 12/1964 | Farkas | 53/79 X |
| 3,318,790 | 5/1967 | Carbaja et al. | 427/41 |
| 3,475,307 | 10/1969 | Knox et al. | 427/41 X |
| 3,549,414 | 12/1970 | Curran et al. | 427/100 |
| 3,826,634 | 7/1974 | Blust et al. | 53/7 X |
| 3,864,161 | 2/1975 | Thompson | 427/100 X |
| 3,914,917 | 10/1975 | Young | 53/79 X |
| 3,981,687 | 9/1976 | Vig | 29/25.35 |

OTHER PUBLICATIONS

Fischer et al., "Direct Plating to Frequency-a Powerful Fabrication Method for Crystals with Closely Controlled Parameters," Proceedings of the 30th Annual Symposium on Frequency Control, Germany, pp. 209-213, (1976).

*Primary Examiner*—Michael F. Esposito
*Assistant Examiner*—Thurman K. Page
*Attorney, Agent, or Firm*—Nathan Edelberg; Sheldon Kanars; Roy E. Gordon

[57] ABSTRACT

The resonant frequencies of a piezoelectric resonator are adjusted either before sealing the resonator into an enclosure or after sealing the resonator into an enclosure or both before and after sealing the resonator into an enclosure. The method makes use of radiation to polymerize a polymerizable gas that has been introduced into the enclosure that houses the resonator. The resulting polymer that deposits on the resonator adjusts the resonant frequencies of the resonator from undesired frequencies to desired frequencies.

26 Claims, No Drawings

METHOD OF ADJUSTING THE FREQUENCY OF PIEZOELECTRIC RESONATORS

The invention described herein may be manufactured, used, and licensed by or for the Government for governmental purposes without the payment to me of any royalty thereon.

BACKGROUND OF THE INVENTION

This invention relates in general to a method of adjusting the resonant frequencies of a piezoelectric resonator and, in particular, to a method of decreasing the resonant frequencies of such a resonator either before sealing the resonator into an enclosure or after sealing the resonator into an enclosure or both before and after sealing the resonator into an enclosure.

The prior art methods of adjusting frequencies are reviewed by Thompson in U.S. Pat. No. 3,864,161, issued Feb. 4, 1975, and by R. Fischer and L. Schulzke, in the paper, "Direct Plating to Frequency — A Powerful Fabrication Method For Crystals With Closely Controlled Parameters," at pages 209 to 213 of the Proceedings of the 30th Annual Symposium on Frequency Control — 1976. The later reference, in particular, discusses the advantages and disadvantages of the various methods used for adjusting the frequencies of resonators. The methods are: mass loading by electroplating, mass removal by etching, spot plating by metal deposition, dielectric mass loading, mass removal by laser trimming, mass loading by sputtering, chemical reaction from a gaseous atmosphers, and direct plating to frequency.

This invention relates to the class of "dielectric mass loading," which Fischer and Schulzke discuss as follows: "Overplating the resonator and its electrode with a dielectric layer of silicon monoxide keeps its mesa-structure nearly unchanged and therefore permits large trimming ranges without significant changes of the energy trapping conditions with filter resonators. The still unresolved problem seems to be the long-time stability of the dielectric layer, which remains chemically active and thus causes drift effects due to gas absorption and/or oxidation. Until now this method has had only a limited range of application to filter resonators."

In the prior art, the frequencies of resonators are adjusted prior to sealing the resonators. Generally, once the resonators are sealed, the frequencies of the resonators can no longer be further adjusted.

SUMMARY OF THE INVENTION

The general object of this invention is to provide an economical method of adjusting the resonant frequencies of a piezoelectric resonator. A further object of the invention is to provide such a method that decreases the frequency of the piezoelectric resonator from an undesired frequency to a desired frequency either before sealing the resonator into an enclosure or after sealing the resonator into an enclosure or both before and after sealing the resonator into an enclosure.

The foregoing objects have now been attained by placing the resonator in an enclosure, creating a vacuum in the enclosure, then backfilling this enclosure with a polymerizable gas, and at the time that an adjustment of the frequencies of the resonator is desired, polymerizing the polymerizable gas with radiation until an amount of polymer is formed on the resonator that causes the frequencies of the resonator to become the desired frequencies. "The frequency" of a resonator usually refers to a fundamental mode resonant frequency. When the resonator is designed for overtone operation, "the frequency" of the resonator refers to the frequency at the particular overtone for which it is designed. As mentioned previously, the frequencies of a resonator can be adjusted, i.e., polymerization carried out by means of radiation, either before sealing the resonator into the enclosure or after sealing the resonator into the enclosure or both before and after sealing the resonator into the enclosure.

In the method of the invention, the polymer is deposited on the piezoelectric resonator in the form of a low stress, pinhole free, inert and stable dielectric film. Polymerization according to the invention is caused by radiation of polymerizable gases such as monomers and dimers.

The source of radiation can be gamma rays, x-rays, ultraviolet light, glow discharge, and electron beam irradiation. Of these types of radiation, the use of glow discharge and ultraviolet light are preferred.

DESCRIPTION OF THE PREFERRED EMBODIMENT

A quartz crystal resonator having a fundamental mode resonant frequency of about 20,010000 MHz is placed in an enclosure including windows made of sapphire. A vacuum is then created in the enclosure, and the enclosure backfilled with 1 torr of tetrafluoroethylene. The resonator is subjected through the sapphire window to ultraviolet light from a low pressure mercury discharge ultraviolet lamp with fused quartz envelope. The tetrafluoroethylene is photo-polymerized to polytetrafluoroethylene which deposits onto the resonator as a film at the rate of about 30 angstroms in thickness per minute. After about 3 minutes, the resonator reaches a frequency of 20.000000 MHz, at which moment the ultraviolet source is shut off. The resonator is then sealed hermetically.

EXAMPLE 2

A quartz crystal resonator having a fundamental mode resonant frequency of about 20.020000 MHz is placed in a ceramic enclosure and a vacuum created in the enclosure. The enclosure is then backfilled with 0.3 torr of hexamethyldisiloxane, and sealed hermetically. An a.c. discharge at a root mean square voltage of about 340V and a frequency of 2 kHz with a current density of 170 $\mu A/cm^2$ is then applied through current leads to electrodes attached to the enclosure. The frequency of the resonator is monitored during the discharge. The polysiloxane polymer film grows at about 300 angstroms per minute. After about 30 seconds, the frequency of the resonator reaches the desired frequency of 20.000000 MHz, at which moment the current is turned off.

EXAMPLE 3

The frequency of a quartz crystal resonator is adjusted to 20.000000 MHz as in the Preferred Embodiment. The resonator is then sealed hermetically in an atmosphere of 1 torr of tetrafluoroethylene. The resonator enclosure consists of a ceramic frame with top and bottom lids made of high purity fused quartz. The resonator is then placed in inventory storage where the frequency is found to drift upward. Six months later a need for this 20.000000 MHz resonator arises. However, a check of the resonator's frequency reveals that while in storage, the frequency of the resonator drifted, that is, the resonator aged, up to 20.000063 MHz. The resonator is then subjected, through the fused quartz windows, to ultraviolet radiation as in the Preferred Embodiment. The tetrafluoroethylene is again photopolymerized to polytetrafluoroethylene which deposits onto the resonator. After about 1 second, the frequency of the resonator reaches 20.000000 MHz at which instant the ultraviolet light is shut off. An ultraviolet laser is then directed onto an area away from the vibrating area of the resonator, such as the inside wall of the ceramic frame, so as to polymerize the remaining tetrafluoroethylene gas and thereby create a vacuum inside the resonator enclosure.

The polymer films, such as in the Preferred Embodiment and in Examples 2 and 3, can exhibit several properties which make them particularly useful for the dielectric tuning of piezoelectric resonators. In the first place, the films are pinhole free down to a very low thickness. For example, a film of 30 angstroms in thickness of polybutadiene, prepared by the ultraviolet photolysis of butadiene is found to be continuous. Then too, the films can withstand heat treatment without damage. That is, a polysiloxane polymer film such as the one formed in Example 2 is not damaged by prolonged annealing in a nitrogen atmosphere at temperatures up to 450° C. Moreover, the films can withstand thermal shock without damage. For example, the polysiloxane film is treated to 300° C for 10 minutes, and immediately dunked into liquid nitrogen to cool it to −196° C. After repeated application of this cycle, neither poor adhesion nor any wrinkling, cracking, or modification of electrical properties is found. Then too, the high thermal stability implies that the films have low vapor pressure, so the films do not produce frequency changes due to mass changes. Moreover, the films are deposited onto surfaces only where the radiation strikes. For example, when desired, a polymer film can be deposited at a small spot on the resonator by immersing the resonator in a monomer gas and irradiating the resonator at the desired spot with a short wavelength ultraviolet laser defocused to the desired spot size. Similarly, any desired pattern can be formed by scanning with a short wavelength ultraviolet laser or by exposing the resonator to ultraviolet light through a mask. Then too, the polymer films undergo plastic deformation when a stress is applied to them, unlike other inorganic films such as the silicon oxides. Therefore, aging due to stress relief in the polymer films has minimal effect on the long-term stability of the resonators. Moreover, the polymer films have very high electrical resistivity, low dissipation factors with a minimum of peaks in the tan δ vs. frequency curves, and have high breakdown voltages. Resistivities as high as $10^{17}$ ohm-cm have been measured, dissipation factor tan δ's are typically $10^{-2}$ to $10^{-3}$, and the breakdown voltages are typically $10^6$ to $10^7$V cm$^{-1}$. Then too, the polymer films can be highly inert chemically. For example, the only chemical found to attack the polysiloxane film is concentrated sodium hydroxide.

A large number of monomers can be used as the polymrizable gas in the invention. These include tetrafluoroethylene, hexamethyldisiloxane, butadiene, hexachlorobutadiene, ethylene, styrene, vinyl fluoride, methyl methacrylate, etc.

The polymer films are grown in the monomer gases which typically are in an enclosure at a pressure of 0.1 to 5 torr. Typical growth rates are on the order of 10 angstroms to 1,000 angstroms per minute. Tetrafluoroethylene, for example, can be photopolymerized using a medium pressure mercury arc lamp type short wavelength ultraviolet source. At a substrate temperature of 30° C, and in a monomer gas at 1 torr of pressure, the film of polytetrafluoroethylene grows at a rate of 30 angstroms per minute. The growth rate increases with decreasing substrate temperature.

When the frequency adjustment is intended to be performed subsequent to sealing, the enclosure for the piezoelectric resonator must be transparent to the radiation that polymerizes the polymerizable gas, or must allow for the provision of the a.c. voltages required to generate a glow discharge. Suitable enclosure materials can be made of fused quartz, sapphire, lithium fluoride, calcium fluoride, magnesium fluoride and high silica glass. Of these enclosure materials, the use of fused quartz or sapphire is preferred because of their high transmission of the radiation, widespread availability, and relative inertness.

The source of radiation would normally be located external to the enclosures although the electrodes for creating a glow discharge may be located within the enclosure. Short wavelength ultraviolet light and glow discharge are preferred as sources of radiation because of their ease of use, ready availability, and low cost.

It is not always necessary to create a vacuum during the polymerization process. That is, the polymerization can be carried out conveniently and economically at atmospheric pressure in an inert gas such as helium or argon mixed with about 0.1 to 5 torr of polymerizable gas. Moreover, an ultraviolet laser can be directed onto the desired areas of the resonator until the desired frequency adjustment has occurred, and then, when necessary, the ultraviolet laser can be directed onto a spot on the enclosure to polymerize the remaining polymerizable gas. It may be necessary to polymerize the remaining polymerizable gas subsequent to the final frequency adjustment procedure because unpolymerized gases may cause aging and thermal hysteresis by adsorption and desorption inside the resonator enclosure. The distance from the ultraviolet source to the enclosure is not critical. All that is necessary is that the wavelengths emitted be absorbed by the monomer gas, and that the intensity and time of exposure be sufficient to deposit the required thickness of polymer film.

When polymerization is to take place subsequent to sealing the enclosure using glow discharge as the source of radiation, the enclosure, for example, may be divided into two sections. One section will contain the resonator positioned between the electrodes necessary for the a.c. discharge. When the polymerizable gas has been polymerized so that the desired adjustment of the frequency has occurred, the remaining polymerizable gas is polymerized in the second section, which may be shielded from the first section.

The method of the invention provides for many uses in the resonator art. For example, the method can be particularly useful in adjusting the frequencies of surface acoustic wave devices, because practical methods of adjusting the frequencies of these devices have been lacking. Moreover, one can form a passivation layer using the method. That is, all metals, except gold, form oxides upon exposure to air. The mass changes and stresses associated with oxide formation are a major cause of aging in piezoelectric resonators. The method of the invention illustrates a method of depositing an inert, low stress, pinhole free, stable dielectric layer on the metal film shortly after its deposition, thus passivating the metal film, and minimizing a major cause of aging.

Then too, the method of the invention may provide for the use of parallel field excited resonators. That is, parallel field excited resonators are superior to the conventional perpendicular field excited resonators in that, as has been discussed by Ianouchevsky and by Warner in the Proceedings of the 17th Annual Symposium on Frequency Control (1963), they show very weak coupling to unwanted modes; they have higher Q's; they have lower aging rates; and, they are less sensitive to thermal shock. Parallel field excited resonators are not being used today for frequency control primarily because of a lack of a practical method of frequency adjusting. The method of this invention illustrates a practical method of depositing an inert, low stress, pinhole free, stable dielectric layer, thus enabling parallel field excited resonators to find use in several applications.

The method of the invention also provides for the use of composed field excited resonators. A composed field excited resonator is one in which the exciting field has a component along both the parallel and perpendicular field directions. It has the advantages of a parallel field excited resonator, without the disadvantage of having a high inductance. An interesting method of achieving a composed field resonator is to make a conventional perpendicular field resonator with very thin, that is, higher than normal resistance, metallic electrodes. By adjusting the thickness, that is, the resistance, of the metallic film electrodes, the directions of the exciting field, and thereby the properties of the resonator, can be varied. Such resonators have not heretofore found application primarily due to the lack of a practical means of adjusting the frequencies of the resonator without the frequency adjustment procedure changing the field direction. The method of this invention illustrates a practical method of depositing a low stress, pinhole free, inert and stable dielectric layer, thus enabling composed field excited resonators to become practical and useful.

The method of the invention also provides a method for the dielectric tuning of filter crystals. That is, the advantages of dielectric tuning of filter crystals, both single and multi-electrode, have been described by D. J. Koneval, W. J. Gerber, and D. R. Curran in the Proceedings of the 20Th Annual Symposium on Frequency Control (1966). The main advantage of the technique is that it allows the fabrication of filters with minimum unwanted modes. It allows the lowering of a filter's frequency without changing its mode spectrum. Unfortunately, the dielectric films chosen by them, silicon monoxide and silicon dioxide, resulted in filters which showed unacceptably high aging rates and low resistances to thermal shock. These difficulties were probably due to the hard, brittle, high stress nature of such films. The method of this invention illustrates a practical method of depositing a low stress, pinhole free, inert and stable dielectric layer, thus enabling the dielectric tuning of filter crystals, including monolithic crystal filters, to become practical and highly useful.

The invention also provides for a method of absorbing unwanted modes of oscillation in piezoelectric resonators. As is known in the art, a dielectric layer deposited over a carefully selected area of a resonator, which can be either bulk wave or surface wave, can serve to absorb unwanted modes of oscillation. The dielectric, usually an epoxy or a silicone, produces outgassing and stresses which lead to undesirable aging. The method of this invention illustrates a method of depositing an inert, low stress, pinhole free and stable dielectric layer that enables this method of absorbing unwanted modes to become practical and useful in several applications.

I wish it to be understood that I do not desire to be limited to the exact details of construction shown and described, for obvious modifications will occur to a person skilled in the art.

What is claimed is:

1. Method of adjusting the frequencies of a piezoelectric resonator prior to sealing the resonator into an enclosure, said method including the steps of
    (A) placing the resonator into an enclosure;
    (B) backfilling the enclosure with a polymerizable gas;
    (C) polymerizing the polymerizable gas with radiation until an amount of polymer is formed on the resonator that causes the frequencies of the resonator to be adjusted to the desired frequencies; and
    (D) sealing the enclosure.

2. Method according to claim 1 wherein the radiation is selected from the group consisting of gamma rays, x-rays, ultraviolet light, glow discharge, and electron beam irradiation.

3. Method according to claim 1 wherein the polymerizable gas is selected from the group consisting of monomers and dimers.

4. Method according to claim 2 wherein the radiation is ultraviolet light.

5. Method according to claim 2 wherein the radiation is glow discharge.

6. Method according to claim 3 wherein the polymerizable gas is selected from the group consisting of hexamethyldisiloxane, butadiene, hexachlorobutadiene, tetrafluoroethylene, ethylene, styrene, vinyl fluoride, and methyl methacrylate.

7. Method according to claim 6 wherein the polymerizable gas is hexamethyldisiloxane.

8. Method according to claim 6 wherein the polymerizable gas is hexachlorobutadiene.

9. Method according to claim 6 wherein the polymerizable gas is tetrafluoroethylene.

10. Method according to claim 4 wherein the enclosure includes a material transparent to ultraviolet radiation capable of polymerizing gases.

11. Method according to claim 1 wherein after step (C) any remaining polymerizable gas is polymerized with radiation in such a manner that the polymer formed is deposited away from the vibrating area of the resonator.

12. Method of adjusting the frequencies of a piezoelectric resonator after sealing the resonator into an enclosure, said method including the steps of
    (A) placing the resonator into an enclosure;
    (B) backfilling the enclosure with a polymerizable gas;
    (C) sealing the enclosure; and
    (D) polymerizing the polymerizable gas with radiation until an amount of polymer is formed on the resonator that causes the frequencies of the resonator to be adjusted to the desired frequencies.

13. Method according to claim 12 wherein the radiation is selected from the group consisting of gamma rays, ultraviolet light, glow discharge, and electron beam irradiation.

14. Method according to claim 12 wherein the polymerizable gas is selected from the group consisting of monomers and dimers.

15. Method according to claim 13 wherein the radiation is ultraviolet light.

16. Method according to claim 13 wherein the radiation is glow discharge.

17. Method according to claim 14 wherein the polymerizable gas is selected from the group consisting of hexamethyldisiloxane, butadiene, hexachlorobutadiene, tetrafluoroethylene, ethylene, styrene, vinyl fluoride, and methyl methacrylate.

18. Method according to claim 17 wherein the polymerizable gas is hexamethyldisiloxane.

19. Method according to claim 17 wherein the polymerizable gas is hexachlorobutadiene.

20. Method according to claim 17 wherein the polymerizable gas is tetrafluoroethylene.

21. Method according to claim 15 wherein the enclosure includes a material transparent to ultraviolet radiation capable of polymerizing gases.

22. Method according to claim 12 wherein after step (D) any remaining polymerizable gas is polymerized with radiation in such a manner that the polymer formed is deposited away from the vibrating area of the resonator.

23. Method of adjusting the frequencies of a piezoelectric resonator prior to sealing the resonator in an enclosure and after sealing the resonator into the enclosure, said method including the steps of
(A) placing the resonator into an enclosure;
(B) backfilling the enclosure with a polymerizable gas;
(C) polymerizing the polymerizable gas with radiation until an amount of polymer is formed on the resonator that causes the frequencies of the resonator to be adjusted to the desired frequencies;
(D) sealing the enclosure;
(E) polymerizing the polymerizable gas inside the enclosure with radiation until an amount of polymer is formed on the resonator that causes the frequencies of the resonator to be readjusted to the desired frequencies; and
(F) directing radiation onto an area of the resonator enclosure away from the vibrating area of the resonator, so as to polymerize the remaining polymerizable gas and thereby create a vacuum inside the resonator enclosure.

24. Method of decreasing the frequency of a quartz crystal resonator having a frequency of about 20.010000 MHz prior to sealing the resonator into an enclosure, said method including the steps of
(A) placing the resonator into an enclosure transparent to short wavelength, ultraviolet light;
(B) backfilling the enclosure with about 1 torr of tetrafluoroethylene;
(C) polymerizing the tetrafluoroethylene with short wavelength, ultraviolet light until an amount of polytetrafluoroethylene is formed on the resonator that causes the frequency of the resonator to be lowered to 20.000000 MHz; and
(D) sealing the enclosure.

25. Method of decreasing the frequency of a quartz crystal resonator having a frequency of about 20.020000 MHz after sealing the resonator into an enclosure, said method including the steps of
(A) placing the resonator into an enclosure;
(B) backfilling the enclosure with about 0.3 torr of hexamethyldisiloxane;
(C) sealing the enclosure; and
(D) polymerizing the hexamethyldisiloxane with an a.c. discharge at a root mean square voltage of about 340V and a frequency of about 2 kHz with a current density of about $170\mu A/cm^2$ until an amount of polyhexamethyldisiloxane is formed on the resonator which causes the frequency of the resonator to be lowered to 20.000000 MHz.

26. method of decreasing the frequency of a quartz crystal resonator prior to sealing the resonator into an enclosure and after sealing the resonator into the enclosure, said method including the steps of
(A) placing a resonator having a frequency of about 20.010000 MHz into an enclosure transparent to short wavelength, ultraviolet light;
(B) backfilling the enclosure with about 1 torr of tetrafluoroethylene;
(C) polymerizing the tetrafluoroethylene with short wavelength, ultraviolet light until an amount of polytetrafluoroethylene is formed on the resonator that causes the frequency of the resonator to be lowered to about 20.000000 MHz;
(D) hermetically sealing the resonator in an atmosphere of 1 torr of tetrafluoroethylene;
(E) allowing the resonator frequency to drift upward;
(F) polymerizing the tetrafluoroethylene with short wavelength, ultraviolet light until an amount of polytetrafluoroethylene is formed on the resonator that causes the frequency of the resonator to be lowered to about 20.000000 MHz; and
(G) directing an ultraviolet laser onto an area of the resonator enclosure away from the vibrating area of the resonator, so as to polymerize the remaining tetrafluoroethylene gas and thereby create a vacuum inside the resonator enclosure.

* * * * *